US010916650B2

(12) United States Patent
Bentley et al.

(10) Patent No.: US 10,916,650 B2
(45) Date of Patent: Feb. 9, 2021

(54) UNIFORM BOTTOM SPACER FOR VFET DEVICES

(71) Applicant: International Business Machines Corporation, Armonk, NY (US)

(72) Inventors: Steven Bentley, Albany, NY (US); Cheng Chi, Jersey City, NJ (US); Chanro Park, Saratoga, NY (US); Ruilong Xie, Schenectady, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/797,208

(22) Filed: Feb. 21, 2020

(65) Prior Publication Data

US 2020/0194587 A1     Jun. 18, 2020

Related U.S. Application Data

(62) Division of application No. 16/039,472, filed on Jul. 19, 2018, now Pat. No. 10,622,475.

(51) Int. Cl.
*H01L 29/78* (2006.01)
*H01L 29/66* (2006.01)
*H01L 21/02* (2006.01)
*H01L 21/8234* (2006.01)

(52) U.S. Cl.
CPC ...... *H01L 29/7827* (2013.01); *H01L 21/0228* (2013.01); *H01L 21/823468* (2013.01); *H01L 29/66553* (2013.01); *H01L 29/66666* (2013.01)

(58) Field of Classification Search
CPC ........... H01L 29/7827; H01L 29/66553; H01L 29/66666; H01L 21/0228; H01L 21/823468
USPC ........................................................ 257/329
See application file for complete search history.

(56) References Cited

U.S. PATENT DOCUMENTS

| 9,165,935 | B2 | 10/2015 | Chung et al. |
| 9,443,982 | B1 | 9/2016 | Balakrishnan et al. |
| 9,647,120 | B1 | 5/2017 | Bi et al. |
| 9,865,730 | B1 | 1/2018 | Jagannathan et al. |
| 10,170,582 | B1* | 1/2019 | Belyansky ........ H01L 21/02183 |
| 10,340,363 | B2 | 7/2019 | Lee |
| 2017/0243974 | A1 | 8/2017 | Mallela et al. |
| 2017/0330965 | A1 | 11/2017 | Basker |

(Continued)

OTHER PUBLICATIONS

"Long Channel Vertical FETs", Disclosed Anonymously, IPCOM000245616D, (Mar. 22, 2016); 3 pages.

(Continued)

*Primary Examiner* — Tu-Tu V Ho
(74) *Attorney, Agent, or Firm* — Cantor Colburn LLP; Joseph Petrokaitis

(57) ABSTRACT

Vertical field effect transistor (VFET) structures and methods of fabrication include a bottom spacer having a uniform thickness. The bottom spacer includes a bilayer portion including a first layer formed of an oxide, for example, and a second layer formed of a nitride, for example, on the first layer, and a monolayer portion of a fourth layer of a nitride for example, immediately adjacent to and intermediate the fin and the bilayer portion.

16 Claims, 4 Drawing Sheets

(56) References Cited

U.S. PATENT DOCUMENTS

2018/0026135 A1 1/2018 Balakrishnan et al.
2020/0027983 A1 1/2020 Bentley et al.

OTHER PUBLICATIONS

List of IBM Patents or Patent Applications Treated as Related; (Appendix P), Date Filed Feb. 21, 2020; 2 pages.
Method and Structure of Forming VFET Bottom Spacer and Replacement Gate Disclosed Anonymously, IPCOM000250753D, (Aug. 30, 2017); 9 pages.

* cited by examiner

UNIFORM BOTTOM SPACER FOR VFET DEVICES

DOMESTIC PRIORITY

This application is a divisional of U.S. patent application Ser. No. 16/039,472, entitled "UNIFORM BOTTOM SPACER FOR VFET DEVICES," filed Jul. 19, 2018 incorporated herein by reference in its entirety.

BACKGROUND

The present invention relates in general to semiconductor device fabrication methods and resulting structures. More specifically, the present invention relates to fabrication methods and resulting semiconductor device structures including a novel design for a uniform bottom spacer of a vertical transport field effect transistor.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins channels and side-gates that can be contacted outside the active region, resulting in increased device density and performance over lateral devices. VFETs are one of the promising alternatives to standard lateral FET structures due to benefits, among others, in terms of reduced circuit footprint. In this type of structure, the current flow is perpendicular to a supporting wafer, unlike the lateral current flow in fin-type FETs (FinFETs). When forming VFETs, spacers need to be provided between and around the vertical fin channel to isolate the bottom source or drain (S/D) region and the top S/D region.

SUMMARY

According to one or more embodiments of the present invention, vertical field effect transistor (VFET) structures and methods for forming a bottom spacer in a VFET structure are provided. A non-limiting example of the method of forming a bottom spacer layer in the vertical field effect transistor (VFET) structure in accordance with one or more aspects of the present invention includes forming one or more vertically oriented fins on a substrate. A first layer is conformally deposited onto the substrate. A second layer is conformally deposited onto the first layer, and a third layer is conformally deposited on the second layer. The third layer is selectively removed so as to completely remove the third layer from sidewalls and top surfaces of the one or more vertically oriented fins. The second layer is selectively removed so as to remove the second layer from sidewalls and top surfaces of the one or more vertically oriented fins, wherein selectively removing the second layer forms a recess immediately adjacent the one or more vertically oriented fins. The first layer and remaining portions of the third layer are selectively removed to the second layer, and a fourth layer is conformally deposited onto the substrate filling the recess immediately adjacent the one or more vertically oriented fins. The fourth layer is selectively removed from the sidewalls and top surfaces of the one or more vertically oriented fins to form a monolayer portion of the fourth layer intermediate the one or more vertically oriented fins and a bilayer portion of the layer and second layer.

A non-limiting example of the method of forming a bottom spacer layer in the vertical field effect transistor (VFET) structure in accordance with one or more aspects of the present invention includes forming one or more vertically oriented fins on a substrate, wherein each of the one or more vertically oriented fins includes a hardmask of silicon borocarbonitride on a top surface thereof. A first oxide layer and a first nitride layer are conformally deposited on the first oxide layer having a substantially uniform thicknesses by atomic layer deposition on the substrate. A second oxide layer having a variable thickness is deposited on the first nitride layer by high density plasma. Exposed portions of the second oxide layer are selectively removed to the first nitride layer so as to completely remove the second oxide layer from sidewalls and top surfaces of the one or more vertically oriented fins. Exposed portions of the first nitride layer are selectively removed to the first and second oxide layers so as to remove the first nitride layer from the sidewalls and top surfaces of the one or more vertically oriented fins, wherein selectively removing the first nitride layer forms a recess immediately adjacent the one or more vertically oriented fins. Exposed portions of the first oxide layer and remaining portions of the second oxide layer are selectively removed to the first nitride layer, and a second nitride layer is conformally deposited onto the substrate filling the recess immediately adjacent the one or more vertically oriented fins. The second nitride layer is selectively removed from sidewalls and top surfaces of the one or more vertically oriented fins to form a monolayer portion of the second nitride layer immediately adjacent to and intermediate the one or more vertically oriented fins and a bilayer portion of the first oxide layer and first nitride layer.

A non-limiting example of a VFET structure in accordance with one or more aspects of the present invention includes one or more vertically oriented fins extending from a substrate. A bottom spacer layer is on the substrate and has a uniform thickness that is less than a vertical height of the one or more vertically oriented fins. The bottom spacer layer includes a bilayer portion and a monolayer portion of a nitride. The bilayer portion includes an oxide layer and a nitride layer on the oxide layer. The monolayer portion of the nitride is intermediate the fin and the bilayer portion.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

PRIOR ART

PRIOR ART

DETAILED DESCRIPTION

The present invention is generally directed to VFET structures and methods to form the VFET structures. More particularly, embodiments of the present invention form a substantially uniform bottom spacer including a nitride/oxide bilayer portion and a silicon borocarbonitride (SiBCN) hardmask. In embodiments of the invention, the substantially uniform bottom spacer can further include a nitride monolayer portion immediately adjacent the fins.

Figure 1:
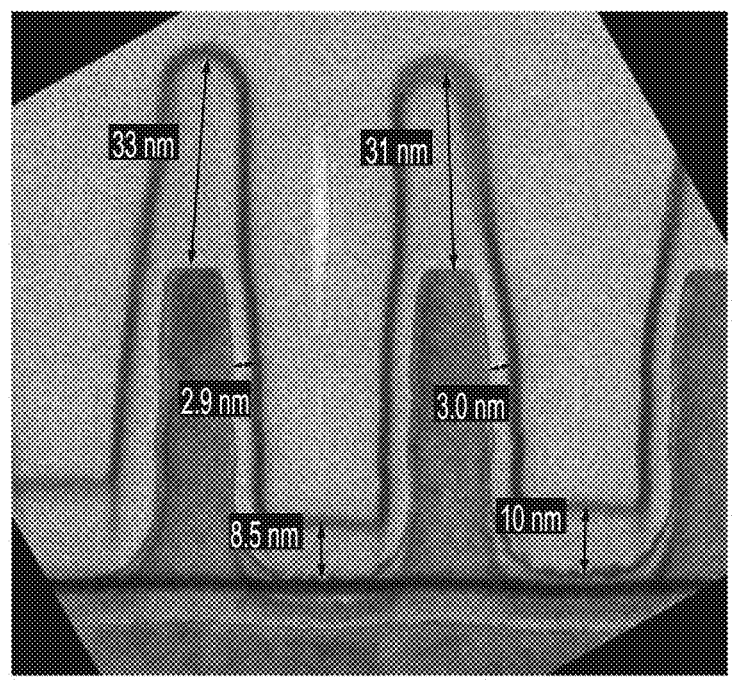
FIG. 1 is a scanning electron micrograph of a prior art vertical field effect transistor (VFET) structure up to formation of a bottom spacer layer exhibiting local thickness variations between fins.
Figure 2:
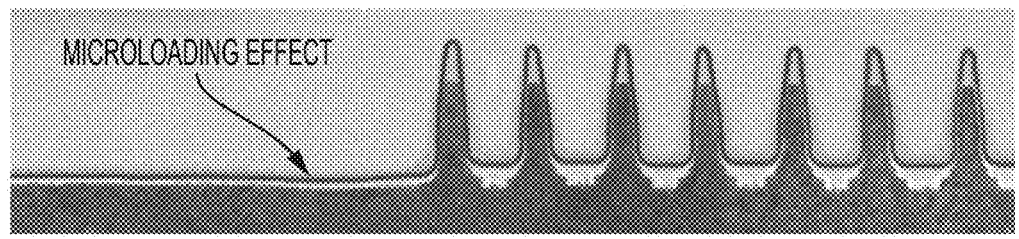
FIG. 2 is a scanning electron micrograph of a prior art VFET structure up to formation of a bottom spacer layer exhibiting thickness variations as a function of microloading effects.

Turning now to a more detailed description of technologies relevant to the present invention, known processes for forming the bottom spacer in VFET structures utilize a combination of atomic layer deposition (ALD) and high density plasma (HDP) to deposit a silicon dioxide layer so as to form the bottom spacer. ALD provides a highly conformal layer whereas HDP is non-conformal, i.e., less than 100% conformal. An etchback process using an etchant selective to the silicon dioxide is then used to remove the silicon dioxide from the sidewalls of the fins, wherein the top fin at this stage of fabrication includes a hardmask so as to protect the critical dimensions of the fin during processing. Oftentimes, the etchant for selective silicon dioxide removal is a buffered hydrofluoric acid solution (BHF) and the hardmask is typically silicon nitride. One of the problems with current processes of record is that the HDP deposition of silicon dioxide is space sensitive resulting in local thickness variations. FIG. 1 provides a micrograph illustrating the thickness variation between fins subsequent to ALD deposition followed by HDP deposition of silicon dioxide onto a substrate including an array of vertically oriented fins. FIG. 2 provides a micrograph showing the microloading effect resulting from the above noted ALD/HDP deposition of silicon dioxide subsequent to an etchback process. As shown, silicon dioxide thickness is markedly less in isolated regions and variable in denser fin regions. The resulting thickness variations can lead to threshold voltage (Vt) shifts due to high k gate dielectric interactions with the oxide bottom spacer. The resulting thickness non-uniformity of the bottom spacer is clearly evident in the illustrated examples. In some prior processes of record, HDP can be used to deposit a nitride layer for the bottom spacer. However, sidewall strip from the fins subsequent to HDP deposition of the nitride layer remains problematic because of hardmask erosion, which are also typically formed of a nitride making etch selectivity difficult. As a result, the process window to minimize erosion of the hardmask is relatively narrow.

As will be described in greater detail herein, in embodiments of the present invention ALD is used to form a thin conformal layer of silicon dioxide on the fins followed by ALD deposition of a conformal layer of silicon nitride to form a bilayer. HDP is then used to deposit oxide onto the bilayer with an etchback process that results in local thickness variations between fins and microloading in isolated regions similar to what has been observed in prior art processes However, the silicon nitride is selectively removed from the fin sidewalls by a wet etch process that is followed by a dry etch process selective to the oxide to the bottom surface to form a recess immediately adjacent the fins. The remaining HDP deposited oxide is then selectively removed resulting in a bilayer of ALD nitride and ALD oxide and the recess immediately adjacent the fins. A conformal layer of ALD silicon nitride is then deposited filling the space followed by etchback of the silicon nitride to fill the recessed space with a monolayer of silicon nitride. The nitride filled recess and the bilayer have the same thickness, thereby providing a substantially uniform bottom spacer. The uniform bottom spacer overcomes the problems noted in the prior art including, without limitation, eliminating the microloading effects, eliminating local thickness variations between fins, and because the HDP oxide does not directly touch the hardmask on the fins during the process of forming the bottom spacer, no hardmask erosion is observed. Moreover, because a nitride bottom monolayer is used in the recess immediately adjacent the fins, threshold voltage issues are minimized.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising", "includes", "including", "has," "having", "contains" or "containing", or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment", "an example embodiment", etc., indicate that the embodiment described can include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right", "left", "vertical", "horizontal", "top", "bottom", and derivatives thereof shall relate to the described structures and methods, as oriented in the drawing figures. The terms "overlying", "atop", "on top", "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to", such as, for example, "a first element selective to a second element", means that a first element can be etched and the second element can act as an etch stop.

For the sake of brevity, conventional techniques related to semiconductor device and integrated circuit (IC) fabrication are not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device utilizing a non-selective low temperature deposition process for forming the top source/drain in a VFET device followed by a low temperature oxidation process to form the non-uniform top spacer according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The terms "about," "substantially," "approximately," and variations thereof, are intended to include the degree of error associated with measurement of the particular quantity based upon the equipment available at the time of filing the application. For example, "about," "substantially," "approximately," and variations thereof, can include a range of ±8% or 5%, or 2% of a given value.

FIGS. 3-10 schematically illustrates cross-sectional views representative of a process for forming a uniform bottom spacer for a VFET structure 100 according to aspects of the invention. It should be apparent that the present invention is not limited to this particular structure nor is it intended to be limited to any particular method for forming the VFET up to formation of the fins.

Figure 3:
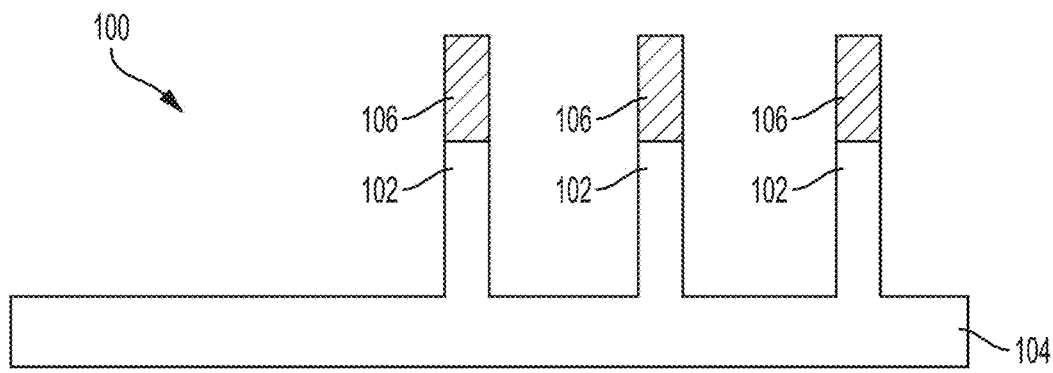
FIG. 3 depicts the cross-sectional view of the VFET structure up to formation of one or more vertically oriented fins according to one or more embodiments of the present invention.

FIG. 3 is a cross sectional view illustrating the VFET structure 100 up to formation of the fins 102, there of which are shown. The fins 102 can be formed from an epitaxy region 104 formed on or part of a substrate, wherein the bottom epitaxy region 104 can be doped (n-type or p-type) to define a bottom source/drain region (not shown). The doping of the bottom epitaxy region 104 can be configured as the bottom source/drain by a variety of methods, such as, for example, diffusion and/or ion implantation, in-situ doped epitaxy, or any other suitable doping techniques.

The substrate can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate. In one or more embodiments and when substrate is a remaining semiconductor material portion of a bulk semiconductor substrate, the substrate can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin can include the same semiconductor material, or a different semiconductor material, from substrate.

In another embodiment, substrate includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 104 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multilayered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate can have a thickness from 1 nm to 200 nm. Other thicknesses that are lesser than, or greater than, the aforementioned thickness range can also be employed as the insulator layer.

The first exemplary semiconductor structure shown in FIG. 3 can be formed by first providing a bulk semiconductor substrate (as defined above) or a SOI substrate (as defined above). Adjacent devices formed on the substrate can be separated by shallow trench isolation regions (not shown). The shallow trench isolation regions can be created early during the semiconductor device fabrication process, e.g., before the transistors such as the illustrated VFET are formed. The key steps for forming the shallow trench isolation regions typically involve etching a pattern of trenches in the substrate, depositing one or more dielectric materials (such as silicon dioxide) to fill the trenches, and removing the excess dielectric using a technique such as chemical-mechanical planarization.

The bottom epitaxy layer 104 can be formed by epitaxial growth and/or deposition. As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 500° C. to 900° C.

The vertically oriented semiconductor fins 102 are formed on and coupled to the bottom epitaxy layer 102. Any known composition and manner of forming the semiconductor fins 102 can be utilized. In one or more embodiments, an undoped channel region is epitaxially deposited over the bottom epitaxy layer 102 and is etched using a patterned hard mask 106 to form a plurality of fins, as described below. The fins 106, three of which are shown, extend vertically from the bottom epitaxy layer 102. Stated differently, the fins 102 are normal to or perpendicular to the substrate including a portion having a shape of a rectangular parallelepiped.

The etching to form the fins 102 can include a dry etching process such as, for example, reactive ion etching, plasma etching, ion etching, or laser ablation. The etching can further include a wet chemical etching process in which one or more chemical etchants are used to remove portions of the blanket layers that are not protected by the patterned hardmask 106.

The direction along which a semiconductor fin 102 laterally extends the most is herein referred to as a "lengthwise direction" of the fin. The height of each semiconductor fin 102 can be in a range from about 5 nm to about 300 nm, although lesser and greater heights can also be employed. The width of each semiconductor fin 102 can be in a range from about 5 nm to about 100 nm, although lesser and greater widths can also be employed. In various embodiments, the fins 102 can have a width in the range of about 4 nm to about 20 nm, or can have a width in the range of about 5 nm to about 15 nm, or in the range of about 6 nm to about 8 nm. In various embodiments, the fin 102 can have a height in the range of about 25 nm to about 75 nm, or in the range of about 40 nm to about 50 nm. Alternatively, the bottom source/drain regions can be formed after the formation of fins.

Multiple fins 102 can be arranged such that the multiple fins 102 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each fin 102 includes a pair of parallel sidewalls along the lengthwise direction.

The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials.

The hardmask 106 can include, for example, a silicon borocarbonitride (SiBCN) hardmask. The hardmask 106 can be deposited using a deposition process, including, but not limited to, PVD, CVD, PECVD, or any combination thereof.

Figure 4:
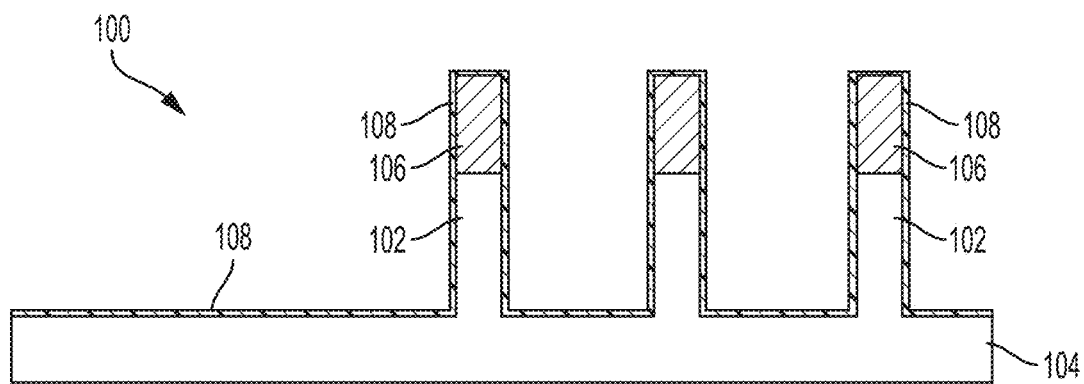
FIG. 4 depicts the cross-sectional view of the VFET structure of FIG. 3 subsequent to conformal deposition of a first layer by atomic layer deposition according to one or more embodiments of the present invention.

FIG. 4 illustrates the VFET structure 100 of FIG. 3 subsequent to ALD of a conformal first layer 108 of an oxide, for example. In one or more embodiments, the conformal first layer 108 is at a thickness of less than about 10 nanometers (nm); in one or more other embodiments, the conformal first layer of 108 is at a thickness of less than about 5 nm; and in still one or more other embodiments, the conformal first layer 108 is at a thickness of about 3 nm or as thin as 1 nm. As noted above, deposition of the first layer 108 by ALD produces a highly conformal layer. ALD is a thin film growth technique that uses alternating and saturation reactions to deposit films in a layer by layer fashion. By repeating this reaction sequence, highly conformal films of any thickness, e.g., monolayers to microns, can be deposited with atomic layer precision.

Figure 5:
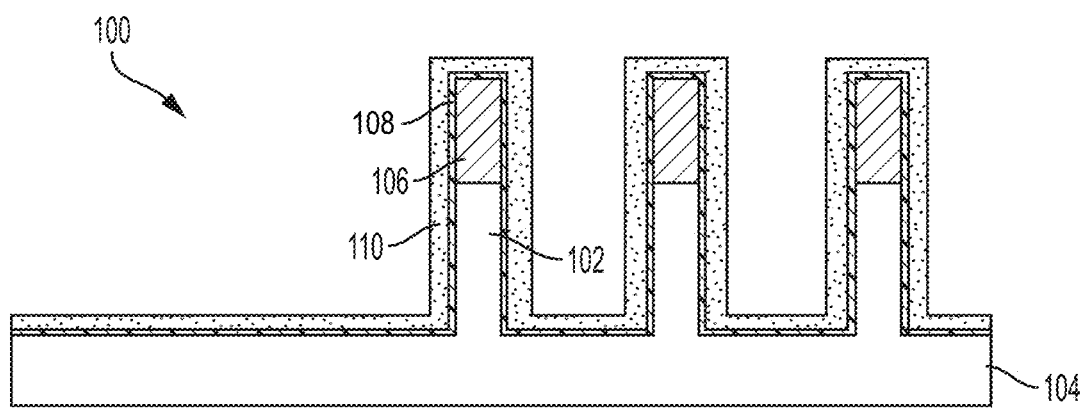
FIG. 5 depicts the cross-sectional view of the VFET structure of FIG. 4 subsequent to conformal deposition of a second layer by atomic layer deposition according to one or more embodiments of the present invention.

FIG. 5 illustrates the VFET structure 100 of FIG. 4 subsequent to ALD deposit of a conformal second layer 110 that is of a different material from the first layer, e.g., a nitride. The deposited second layer, e.g., silicon nitride, as well as the first layer are of uniform thickness because of atomic layer deposition. In one or more embodiments, the conformal second layer 110 of nitride, for example, is at a thickness of less than about 20 nanometers (nm); in one or more other embodiments, the conformal second layer 110 is at a thickness of less than about 10 nm; and in still one or more other embodiments, the conformal second layer 110 is at a thickness of about 3 nm to 10 nm. In one or more embodiments, the thickness of the conformal second layer 110 is at least twice the thickness of the conformal first layer 108.

Figure 6:
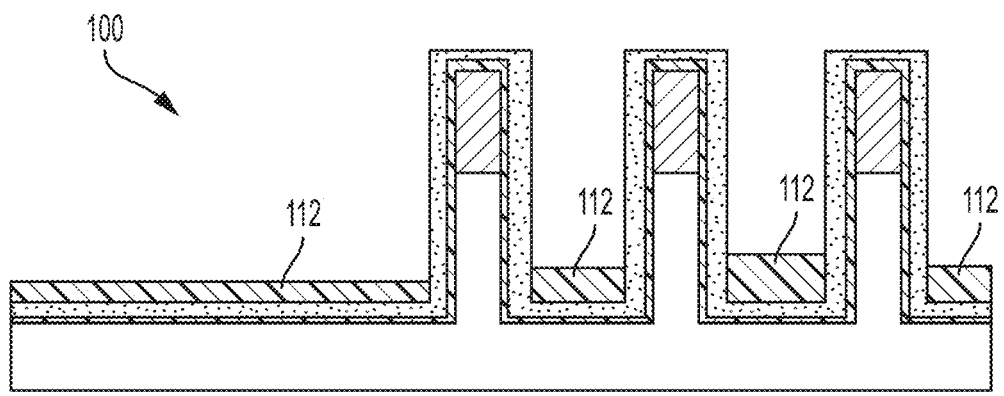
FIG. 6 depicts an enlarged cross-sectional view of the of the VFET structure of FIG. 5 subsequent to non-conformal deposition of a third layer by high density plasma according to one or more embodiments of the present invention.

FIG. 6 illustrates the VFET structure 100 of FIG. 5 subsequent to HDP deposition of a non-conformal third layer 112, can be an oxide the same as or different oxide compared to the first layer, e.g., silicon dioxide, followed by etchback selective to the second layer 110 so as to remove only the third layer from the sidewalls and top surface of the fins. As shown, thickness variations of the remaining third layer 112 subsequent to the etchback process is evident as microloading effects are observed in less dense regions and local thickness variations are shown between fins.

Figure 7:
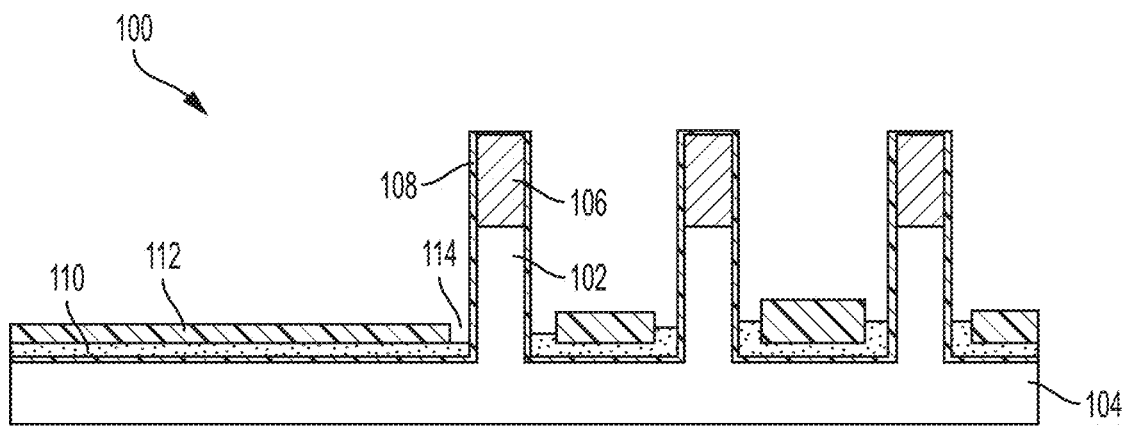
FIG. 7 depicts an enlarged cross-sectional view of the of the VFET structure of FIG. 6 subsequent selective removal of the second layer from sidewalls and top surfaces of the fins according to one or more embodiments of the present invention.

FIG. 7 illustrates the VFET structure 100 of FIG. 6 subsequent to selective etching selective to the third layer 112 of the exposed second layer 110 from the sidewalls and top surfaces of the fins and the exposed portions of second layer 110 immediately adjacent the fins to create a recess 114. It should be noted that the term "selective to," such as, for example, "a first element selective to a second element," means that the first element can be etched and the second element can act as an etch stop. By way of example, a mixture of phosphoric acid ($H_3PO_4$) and water at elevated temperatures of about 140 to about 180° C. can be used to selectively etch a second layer of nitride 110 rather than third layer 112 formed of an oxide.

Figure 8:
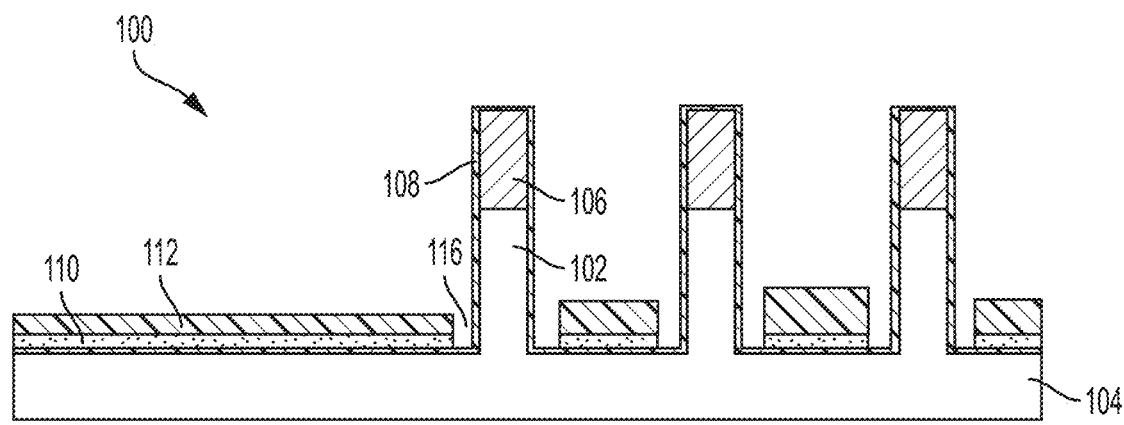
FIG. 8 depicts an enlarged cross-sectional view of the of the VFET structure of FIG. 7 subsequent to selective removal of the second layer from a bottom surface of the substrate to form a recess immediately adjacent each of fins according to one or more embodiments of the present invention.

FIG. 8 illustrates the VFET structure 100 of FIG. 7 subsequent to etching selective to the third layer 112 of the exposed portion of the second layer 110 immediately adjacent the fins to create a recess 116, which exposes the bottom epitaxial surface 104. By way of example, a dry etch process selective to the third layer can be used to create the recess 116 immediately adjacent to the fins.

Figure 9:
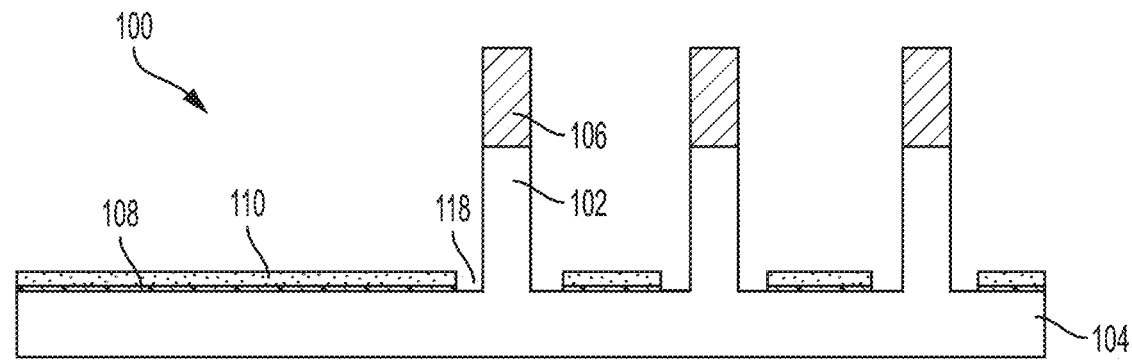
FIG. 9 depicts an enlarged cross-sectional view of the of the VFET structure of FIG. 8 subsequent selective removal of the third layer according to one or more embodiments of the present invention.

FIG. 9 illustrates the VFET structure 100 of FIG. 8 subsequent to etching selective to the second layer or silicon (e.g., the fin channel region) to remove exposed portions of first and third layers 108 and 112. In one or more embodiments, a wet etchant solution is applied. By way of example, the etchant solutions for selective removal of oxides can include $HNO_3$, HCL, $H_2SO_4$, HF or combinations thereof. By way of example, the wet etching process can be a buffered oxide etch, which is also known as a buffered HF or BHF. BHF is a mixture of a buffering agent, such as ammonium fluoride ($NH_4F$), and hydrofluoric acid (HF). HCl can be added to the BHF solutions if needed to dissolve any insoluble products that can form during the etch back.

A common buffered oxide etch solution includes a 6:1 volume ratio of 40% $NH_4F$ in water to 49% HF in water. The buffered oxide etch solution will etch the oxide at approximately 2 to 4 nanometers per second at 25 degrees Celsius. Temperature can be increased as needed to raise the etching rate.

The resulting VFET structure 100 includes a bilayer of the remaining ALD deposited second layer 110 and the underlying ALD deposited first layer 108, which is protected by the second layer 110, and recesses 118 immediately adjacent the fins 102. Because the first layer 108 and second layers 110 were deposited by ALD, the thicknesses are uniform between the fin and in less dense regions.

Figure 10:
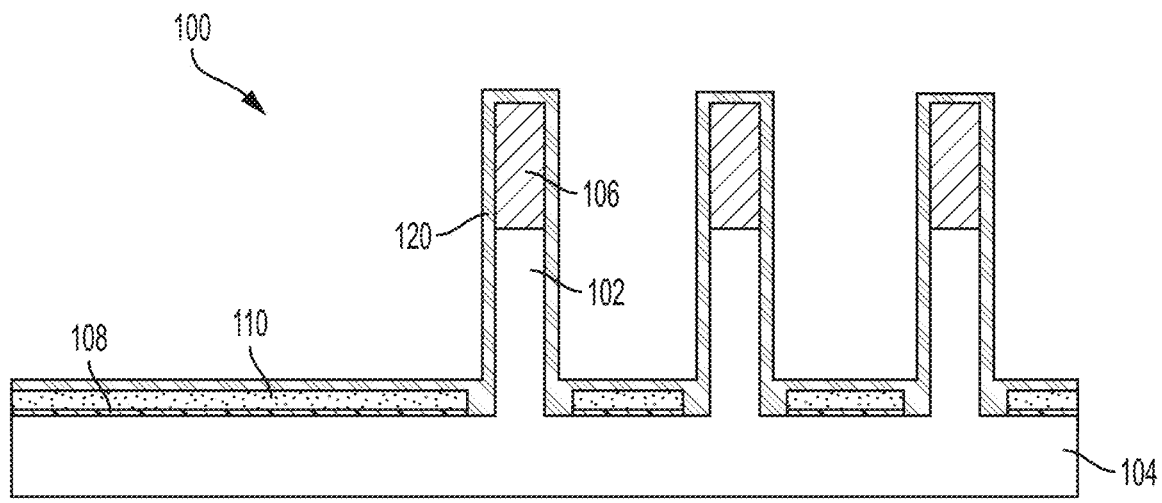
FIG. 10 depicts an enlarged cross-sectional view of the of the VFET structure of FIG. 9 subsequent to conformal deposition of a fourth layer by atomic layer deposition filling the recess according to one or more embodiments of the present invention.

FIG. 10 illustrates the VFET structure 100 of FIG. 9 subsequent to ALD deposition of a conformal layer of a fourth layer 120, which can be of the same class of material as the second layer, e.g., nitrides. The ALD deposition is continued to provide a thickness effective to fill the recess 118 shown in FIG. 10 with the fourth layer. The thickness of the fourth layer deposited is generally less than 10 nm. There is no damage to the hardmask 106 and the ALD provides a very conformal coating thereon. The conformal fourth layer 120 can be the same as or a different nitride than second layer 110, for example.

Figure 11:
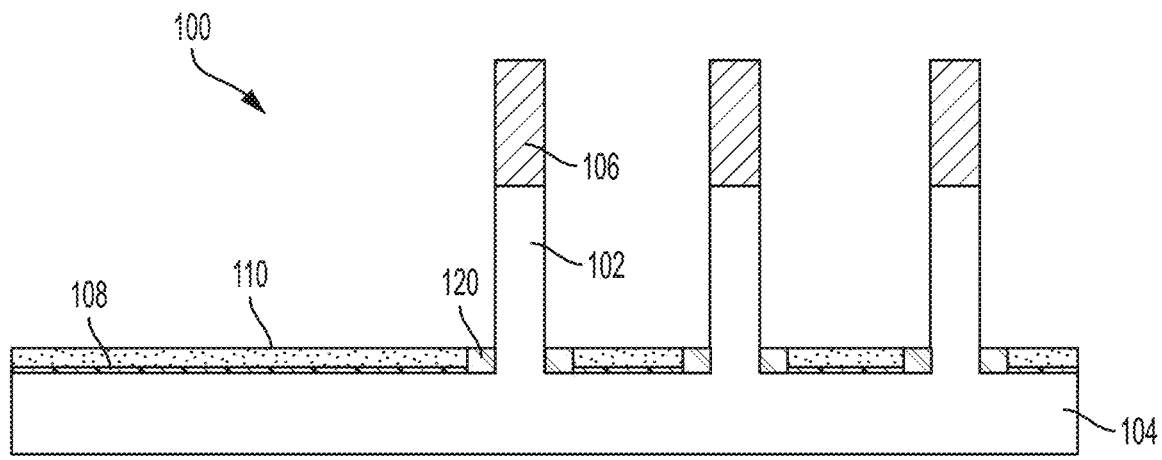
FIG. 11 depicts an enlarged cross-sectional view of the of the VFET structure of FIG. 10 subsequent to selective removal of the fourth layer from sidewalls and top surface of the fins so as to form the bottom spacer according to one or more embodiments of the present invention

FIG. 11 illustrates the VFET structure 100 of FIG. 10 subsequent to an etch back process. The etchback process can include applying a wet etchant solution selective to the SiBCN hardmask and removes the fourth layer from the exposed surfaces. For example, a fourth layer formed of silicon nitride can be selectively removed using be selectively removed using a solution of hydrofluoric acid diluted with ethylene glycol (HFEG). The resulting bottom spacer for the VFET structure includes a bilayer portion of the first and second layers and a monolayer portion of the fourth layer immediately adjacent to and intermediate the fins and the bilayer portion. Advantageously, the bottom spacer and method of forming the bottom spacer in the VFET structure 100 eliminates microloading and local variation issues, provides a monolayer portion of a nitride, for example, immediately adjacent the fins, which eliminates any threshold voltage issues, and because the HDP deposited third layer does not directly touch the hardmask, there is no hardmask damage.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A vertical field effect transistor (VFET) structure comprising:
   one or more vertically oriented fins extending from a substrate; and
   a bottom spacer layer on the substrate having a uniform thickness less than a vertical height of the one or more vertically oriented fins, the bottom spacer layer comprising a bilayer portion including an oxide layer and a nitride layer on the oxide layer, and a monolayer portion of a nitride intermediate the fin and the bilayer portion.

2. The VFET structure of claim 1, wherein the nitride layer in the bilayer portion is at least twice a thickness of the oxide layer.

3. The VFET structure of claim 1, wherein the nitride in the monolayer portion is different from the nitride in the bilayer portion.

4. The VFET structure of claim 1, wherein the bilayer portion and the monolayer portion are deposited by atomic layer deposition.

5. The VFET structure of claim 1, wherein each of the one or more vertically oriented fins comprises a silicon borocarbonitride hardmask.

6. The VFET structure of claim 1, wherein the substrate comprises an epitaxy region, wherein the one or more vertically oriented fins extend from the epitaxy region.

7. The VFET structure of claim 6, wherein the epitaxy region comprises dopants to define a bottom source/drain region for the VFET.

8. The VFET structure of claim 1, wherein the one or more vertically oriented fins extending from the substrate have a height dimension of about 5 nanometers (nm) to about 300 nm, and a width dimension of about 5 nm to about 100 nm.

9. The VFET structure of claim 1, wherein the oxide layer is at a thickness of less than about 10 nm.

10. The VFET structure of claim 1, wherein the oxide layer comprises silicon dioxide.

11. The VFET structure of claim 1, wherein the nitride layer comprises silicon nitride.

12. The VFET structure of claim 1, wherein the nitride layer is at a thickness of less than 20 nm.

13. The VFET structure of claim 1, wherein the monolayer portion comprises silicon nitride.

14. The VFET structure of claim 1, wherein the nitride layer in the bilayer and the nitride in the monolayer are different nitrides.

15. The VFET structure of claim 1, wherein the nitride layer in the bilayer and the nitride in the monolayer are the same nitride.

16. The VFET structure of claim 1, wherein the one or more vertically oriented fins extending from the substrate have a variable pitch.

* * * * *